(12) United States Patent
Shirakawa

(10) Patent No.: US 6,228,171 B1
(45) Date of Patent: May 8, 2001

(54) HEAT PROCESSING APPARATUS

(75) Inventor: Eiichi Shirakawa, Kumamoto (JP)

(73) Assignee: Tokyo Electron Ltd. (JP)

( * ) Notice: Subject to any disclaimer, the term of this patent is extended or adjusted under 35 U.S.C. 154(b) by 0 days.

(21) Appl. No.: 09/239,997

(22) Filed: Jan. 29, 1999

(51) Int. Cl.$^7$ .................................................. B05C 5/02

(52) U.S. Cl. .................... 118/666; 118/724; 118/725; 118/641; 118/58; 118/69

(58) Field of Search .................... 118/666, 667, 118/724, 725, 641, 50, 58, 69; 427/374.1, 374.2, 374.3, 398.2

(56) References Cited

U.S. PATENT DOCUMENTS

| | | | |
|---|---|---|---|
| 4,886,571 | * 12/1989 | Suzuki et al. | 156/345 |
| 5,817,178 | * 10/1998 | Mita et al. | 118/666 |

FOREIGN PATENT DOCUMENTS 1-168026  7/1989 (JP) .

* cited by examiner

*Primary Examiner*—Laura Edwards
(74) *Attorney, Agent, or Firm*—Rader, Fishman, & Grauer

(57) ABSTRACT

A heat processing apparatus comprises a heating section having a hot plate for heating a substrate in a heat conduction manner, refrigeration medium for decreasing temperature of the hot plate in a heat exchange manner by bring the refrigeration medium in direct or indirect contact with the hot plate, a refrigeration section for storing the refrigeration medium while cooling, a transport mechanism for taking out the refrigerant from the refrigeration section, transporting the refrigeration medium to the heating section, mounting the refrigeration medium on the hot plate, picking up the refrigeration medium from the hot plate, taking out the refrigeration medium from the heating section, and transporting the refrigeration medium to the refrigeration section, setting mechanism for setting a heat processing temperature for the substrate, and a controller for controlling temperature of the hot plate by using the refrigeration medium so as to reach the heat processing temperature set by the setting mechanism.

14 Claims, 8 Drawing Sheets

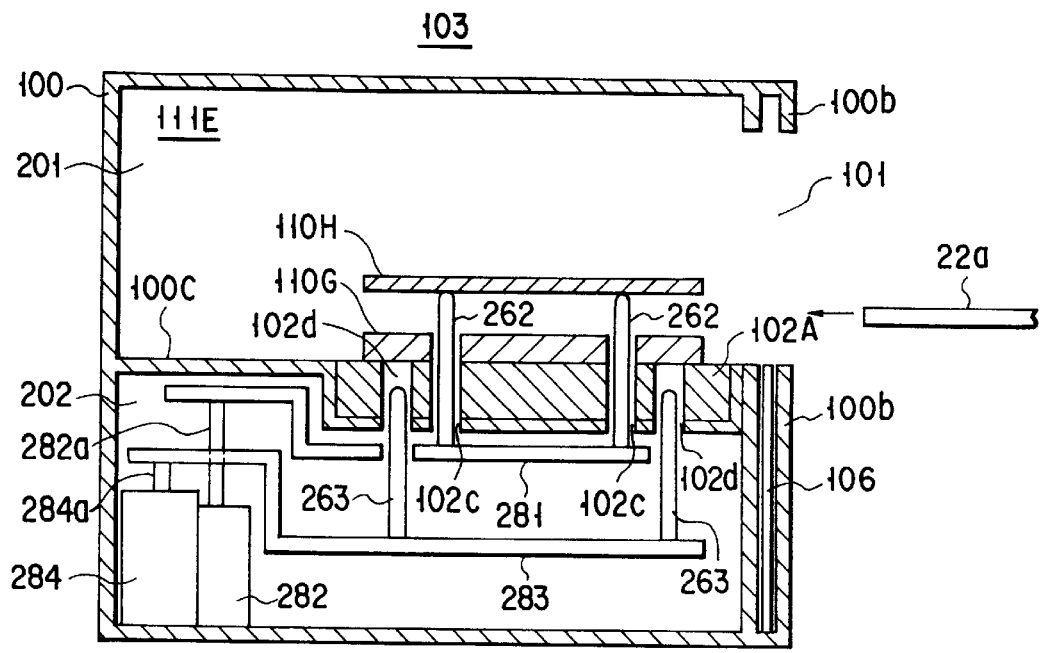
FIG. 11
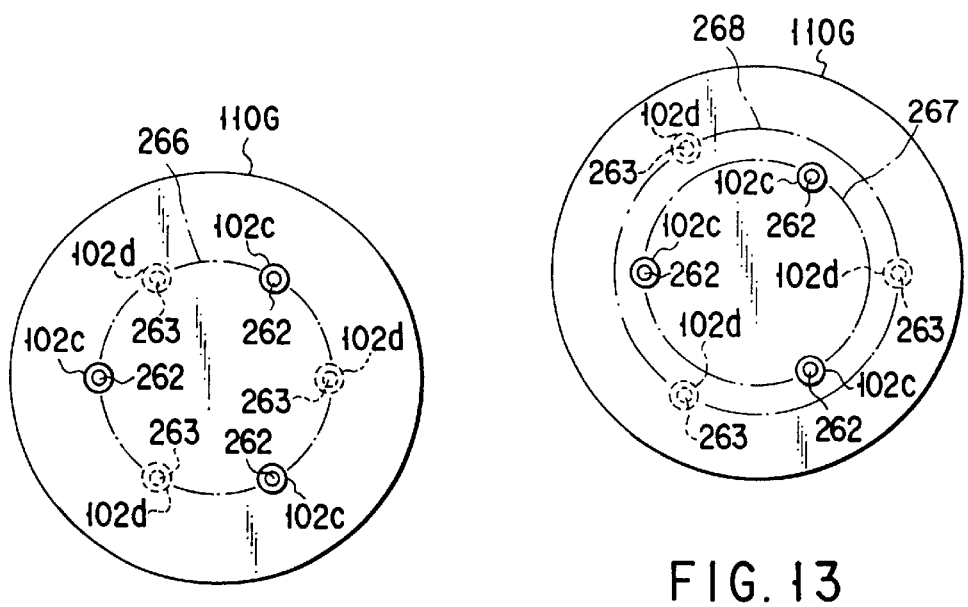
FIG. 12
FIG. 13

HEAT PROCESSING APPARATUS

BACKGROUND OF THE INVENTION

The present invention relates to a heat processing apparatus such as a heating apparatus and a preheating apparatus to be installed in a semiconductor manufacturing system for manufacturing a semiconductor device.

In a photolithography process for manufacturing a semiconductor device and an LCD, resist is coated on a substrate, and the resultant resist coating film is exposed to light and developed. Such a series of processing is carried out in a coating/developing system. The coating/developing system has heating units such as a prebake unit and a postbake unit. These heating units have a hot plate with a built-in heater of a resistance heating type.

The wafers W are processed in units (lots) each consisting of, e.g., 25 wafers. Each lot is processed under the same recipe (individual processing program). Heating is performed under the conditions such as prebaking temperature and postbaking temperature according to the recipe. The wafers belonging in the same lot are heated under the same conditions.

Then, when one lot is completed and a new lot is subjected to the processing, the recipe is switched to a new recipe, accordingly, so that temperature of the hot plate changes. When the heat processing temperature is allowed to change from a low temperature range to a high temperature range, the temperature of the hot plate can be changed immediately if electric supply to the hot plate is increased. However, the heat processing temperature is allowed to switch from the high temperature range to the low temperature range, the temperature of the hot plate cannot be decreased in a short time. This is because a conventionally used heating unit employs an air cooling method. To be more specifically, the hot plate is cooled by blowing a cold air thereon. Since the hot plate (metal disk of approximately 16 mm thick) has a large heat capacity, it takes a long time to decrease the temperature of the hot plate to a desired temperature, thus lowering a throughput.

To overcome the low throughput, if hot plates are provided so as to correspond to the number of different recipes, the hot plates will occupy a huge space. As a result, the apparatus will increase in size and its control system will be more complicated.

To use a single hot plate for different heat processes, it is possible to consider an apparatus equipped with a hot plate having a refrigerant circulating therein to cool the hot plate in a short time. The apparatus of this type has a problem in that the structure of the hot plate becomes complicated, increasing the manufacturing cost.

BRIEF SUMMARY OF THE INVENTION

An object of the present invention is to provide a heat processing apparatus capable of decreasing temperature of a hot plate in a short time and in a high throughput without complicating a control system.

The heat processing apparatus according to the present invention has a heating section having a hot plate for heating a substrate in a heat conduction manner;

refrigeration medium for decreasing temperature of the hot plate in a heat exchange manner by bringing the refrigeration medium in direct or indirect contact with the hot plate;

a refrigeration section for storing the refrigeration medium while cooling;

a transport mechanism for taking out the refrigeration medium from the refrigeration section, transporting the refrigeration medium to the heating section, mounting the refrigeration medium on the hot plate, picking up the refrigeration medium from the hot plate, taking out the refrigeration medium from the heating section, and transporting the refrigeration medium to the refrigeration section;

setting means for setting a heat processing temperature for the substrate; and a controller for controlling temperature of the hot plate by using the refrigeration medium so as to reach the heat processing temperature set by the setting means.

The heat processing apparatus further comprises a sensor for detecting temperature of the hot plate.

In this case, it is preferable that the controller should control the contact time for the hot plate in contact with the refrigeration medium on the basis of the temperature of the hot plate detected by the sensor and the heat processing temperature determined.

In the case where the refrigeration medium includes a plurality of refrigeration members different in heat capacity, it is preferable that the controller should select one or two refrigeration members from the refrigeration members on the basis of the temperature of the hot plate detected by the sensor and the heat processing temperature determined, and that the transport mechanism should transport the one or two refrigeration members selected, from the refrigeration section to the heating section, mounting the one or two refrigeration members on the hot plate to allow the one or two refrigeration members in contact with the hot plate for the contact time, and transporting the one or two refrigeration members from the heating section to refrigeration section.

In the case where the refrigeration medium includes a plurality of refrigeration members different in heat capacity, the refrigeration members may be different in thickness and in material.

Furthermore, it is preferable that the controller should control temperature for cooling the refrigeration medium in the refrigeration section on the basis of the temperature of the hot plate detected by the sensor and the heat processing temperature determined.

It is further preferable that the refrigeration medium has a plan-view shape substantially the same as that of the substrate.

It is still preferable that the refrigeration medium should be made of a material containing no harmful ingredients to not only the substrate but also a film formed on the substrate.

Incidentally, it is preferable that the transporting mechanism should place the refrigeration medium on the hot plate so as to cover an area of the hot plate at which the substrate comes in contact with the hot plate or near which the substrate is placed so as to face the hot plate.

Furthermore, the refrigeration section has a plurality of cooling plates each cooling the corresponding refrigeration medium refrigerant in a heat conduction manner, a lift mechanism having a plurality of pins pushing up the refrigeration medium from each of the cooling plates; and a plurality of compartments each surrounding the corresponding cooling plate.

The refrigeration section has a cooling plate for collectively cooling the refrigeration medium stacked one upon the other in multiple stages, a lift mechanism having a plurality of pins for pushing up at least one of the refrigeration medium from the cooling plate, and a compartment surrounding the cooling plate.

In this case, the pins may be arranged on a common concentric circle in the same plane.

Alternatively, the pins are arranged by being divided on two concentric circles in the same plane.

Note that it is preferable that a high purity silicon (Si), silica glass ($SiO_2$) and silicon carbide (SiC) may be used as the refrigeration medium. This is because they are stable even in a high temperature range and no possibility of contaminating a silicon wafer.

The refrigeration medium desirably has substantially the same plan-view shape as the substrate. In this case, the refrigeration medium refrigerants can be designed so as to have various heat capacities by changing thickness and material of the refrigeration medium.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a longitudinal sectional view showing the refrigeration section of the apparatus according to an embodiment;

FIG. 12 is a plan view showing a refrigerant according to another embodiment;

FIG. 13 is a plan view showing a refrigerant according to still another embodiment.

DETAILED DESCRIPTION OF THE INVENTION

Now, various preferred embodiments of the present invention will be explained with reference to the accompanying drawings.

Figure 1:
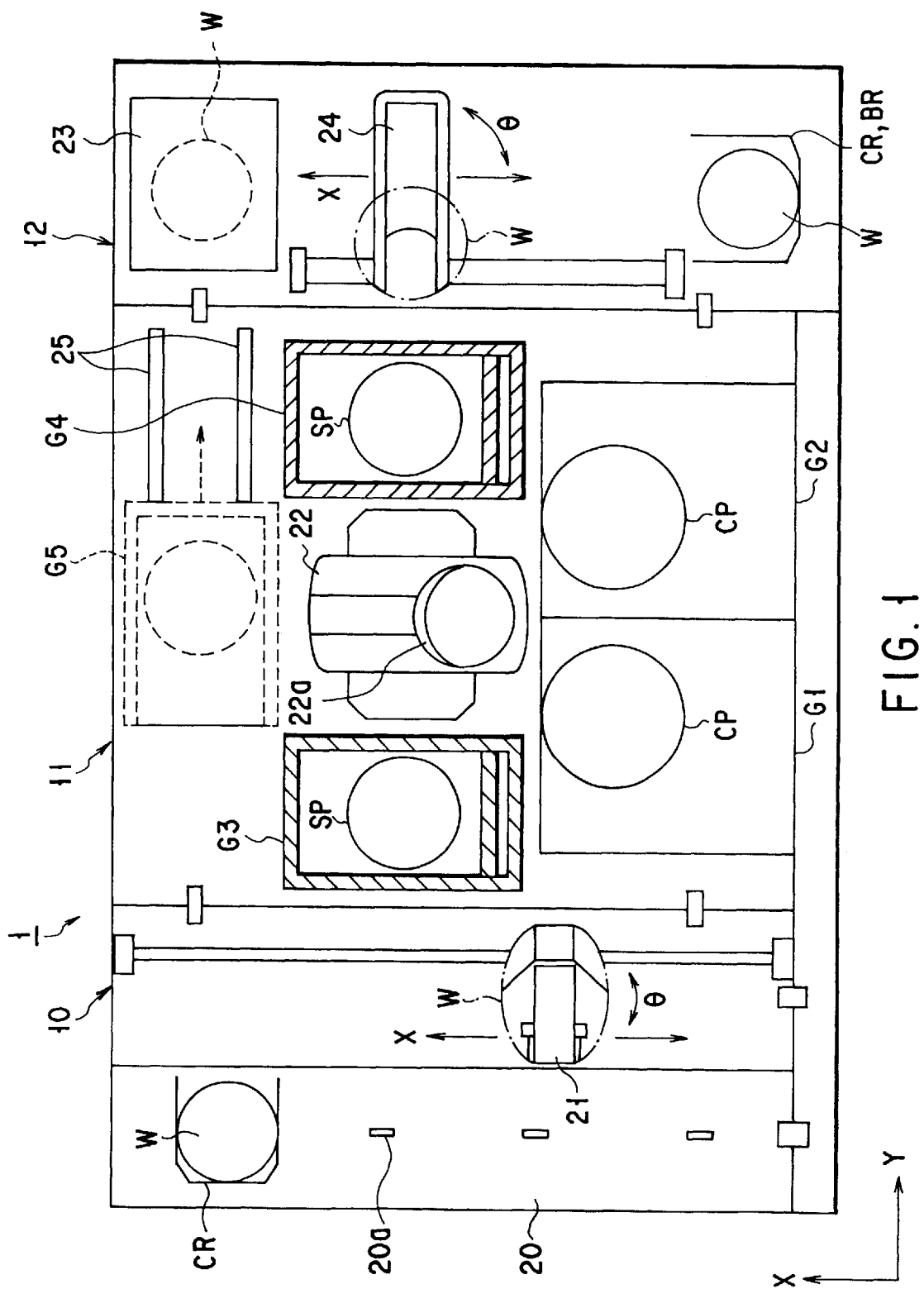
FIG. 1 is a schematic plan view showing a coating/developing system.
Figure 2:
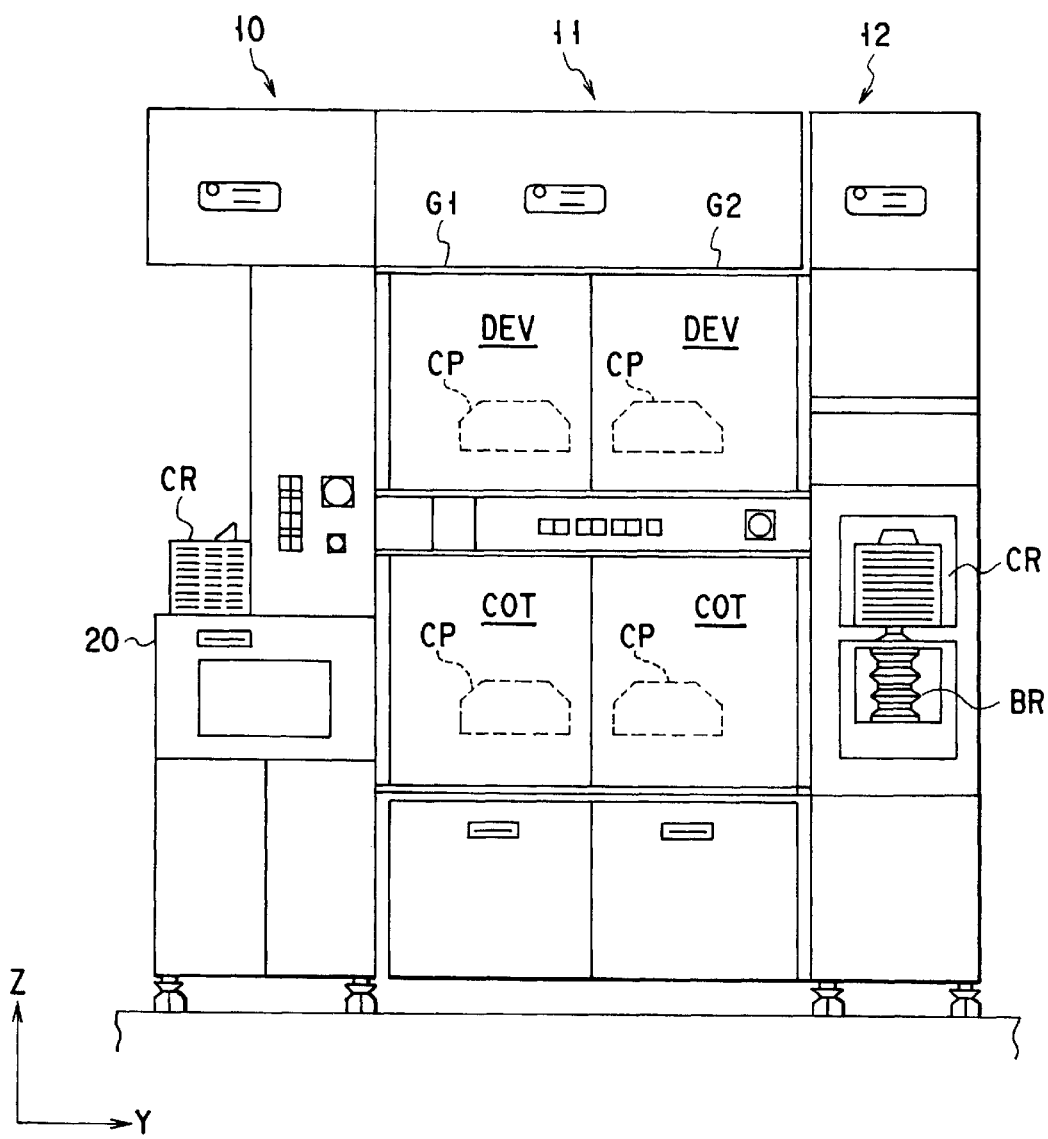
FIG. 2 is a front view of the coating/developing system.
Figure 3:
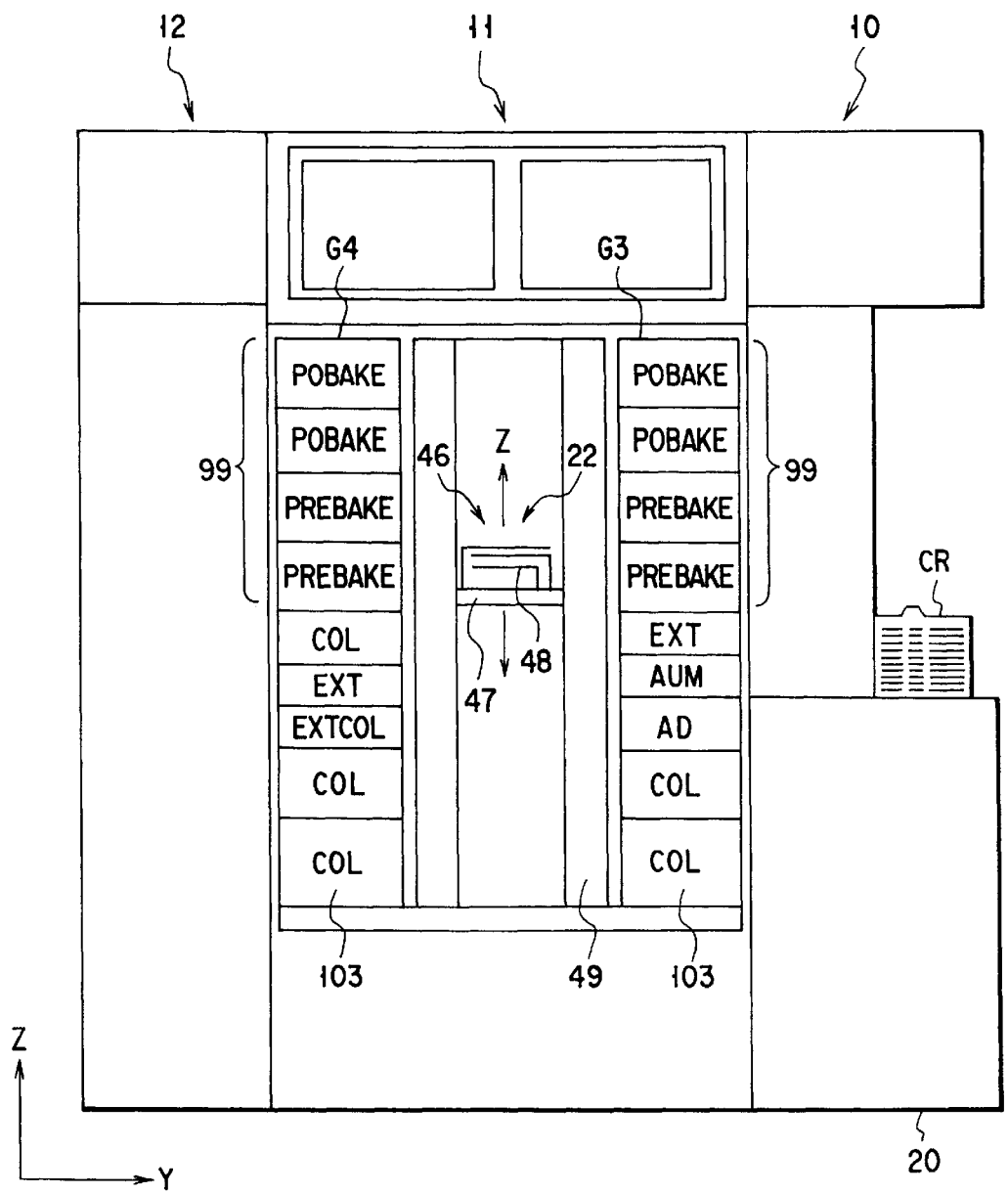
FIG. 3 is a rear view of the coating/developing system.

As shown in FIGS. 1–3, a coating/developing system 1 has a load/unload section 10, a process section 11, and an interface section 12. The load/unload section 10 has a cassette table 20 on which cassettes CR storing e.g., 25 semiconductor wafers W for each, is loaded/unloaded. The process section 11 has various single wafer processing units for processing wafers W sequentially one by one. The interface section 12 is arranged between the process section 11 and a light-exposure apparatus (not shown).

Four projections 20a are formed on the cassette table 20. Four cassettes CR are positioned respectively in right places to the process section 11 by means of these projections 20a. Each of the cassettes CR mounted on the table 20 has a load/unload opening facing the process section 11.

In the load/unload section 10, a first sub-arm mechanism 21 is formed which is responsible for loading/unloading the wafer W into/from each cassette CR. The first sub arm mechanism 21 has a holder portion for holding the wafer W, a back and forth moving mechanism (not shown) for moving the holder portion back and forth, an X-axis moving mechanism (not shown) for moving the holder portion in an X-axis direction, a Z-axis moving mechanism (not shown) for moving the holder portion in a Z-axis direction, and a θ rotation mechanism (not shown) for swinging the holder portion around the Z-axis.

The first sub-arm mechanism 21 can gain access to an alignment unit (ALIM) and an extension unit (EXT) belonging to a third process unit group G3.

As shown in FIG. 3, a main arm mechanism 22 is liftably arranged at the center of the process section 11. Five process units G1–G5 are arranged around the main arm mechanism 22. The main arm mechanism 22 is arranged within a cylindrical supporting frame 49 and has a liftable wafer transporting apparatus 46. The cylindrical supporting frame 49 is connected to a driving shaft of a motor (not shown). The driving shaft can be rotated about the Z-axis in synchronism with the wafer transporting apparatus 46 by an angle of θ. The wafer transporting apparatus 46 has a plurality of holder portions movable in a front and rear direction of a transfer base table 47.

Units belonging to first and second process unit groups G1, G2, are arranged at the front side of the system 1. Units belonging to a third process unit group G3 are arranged next to the load/unload section 10. Units belonging to a fourth process unit group G4 are arranged next to the interface section 12. Units belonging to a fifth process unit group G5 are arranged at a back side of the system 1.

As shown in FIG. 2, the first process unit group G1 has two spinner-type process units for applying a predetermined process to the wafer W mounted on a spin chuck within the cup CP. In the first process unit G1, for example, a resist coating unit (COT) and a developing unit (DEV) are stacked in two stages sequentially from the bottom. In the second process unit group G2, two spinner type process units such as a resist coating unit (COT) and a developing unit (DEV) in two stages sequentially from the bottom. The resist coating unit (COT) is preferably set at a lower stage than the developing unit (DEV). This is because a discharge line for the resist waste solution is desired to be shorter than a developing waste solution since the resist waste solution is more difficult to discharge than the developing waste solution. However, if necessary, the resist coating unit (COT) may be arranged at the upper stage than the developing unit (DEV).

As shown in FIG. 3, the third process unit group G3 has a cooling unit (COL), an adhesion unit (AD), an alignment unit (ALIM), an extension unit (EXT), a prebaking unit (PREBAKE), and postbaking unit (POBAKE) which are stacked sequentially from the bottom.

Similarly, the fourth process unit group G4 has a cooling unit (COL), an extension cooling unit (EXTCOL), an extension unit (EXT), a cooling unit (COL), a prebaking unit (PREBAKE) and a postbaking unit (POBAKE).

As mentioned, the cooling unit (COL) and the extension cooling unit (EXTCOL) to be operated at low processing temperatures, are arranged at lower stages and the baking unit (PREBAKE), the postbaking unit (POBAKE) and the adhesion unit (AD) to be operated at high temperatures, are arranged at the upper stages. With this arrangement, thermal interference between units can be reduced. Note that a unit 103 of the cooling units (COL) positioned at the lowest stage is used as a refrigerator (refrigeration unit) for refrigerating and storing a refrigeration medium 110.

At the front side of the interface section 12, a movable pick-up cassette CR and an non-movable buffer cassette BR are arranged in two stages. At the back side of the interface section 12, a peripheral light exposure apparatus 23 is arranged. At the center portion of the interface section 12, a second sub-arm mechanism 24 is provided, which is movable independently in the X and Z directions, and which is capable of gaining access to both cassettes CR and BR and the peripheral light exposure apparatus 23. In addition, a second sub-arm mechanism 24 is rotatable around the Z-axis by an angle of θ and capable of gaining access to the extension unit (EXT) belonging to the fourth processing unit G4 and to a wafer transfer table (not shown) near the light exposure apparatus (not shown).

In the system 1, the fifth processing unit group G5 can be arranged at the back side of the main arm mechanism 22. The fifth processing unit G5 can be slidably shifted in the Y-axis direction along a guide rail 25. Since the fifth processing unit group G5 can be shifted as mentioned, maintenance operation can be applied to the main arm mechanism 22 easily from the back side.

Figure 4:
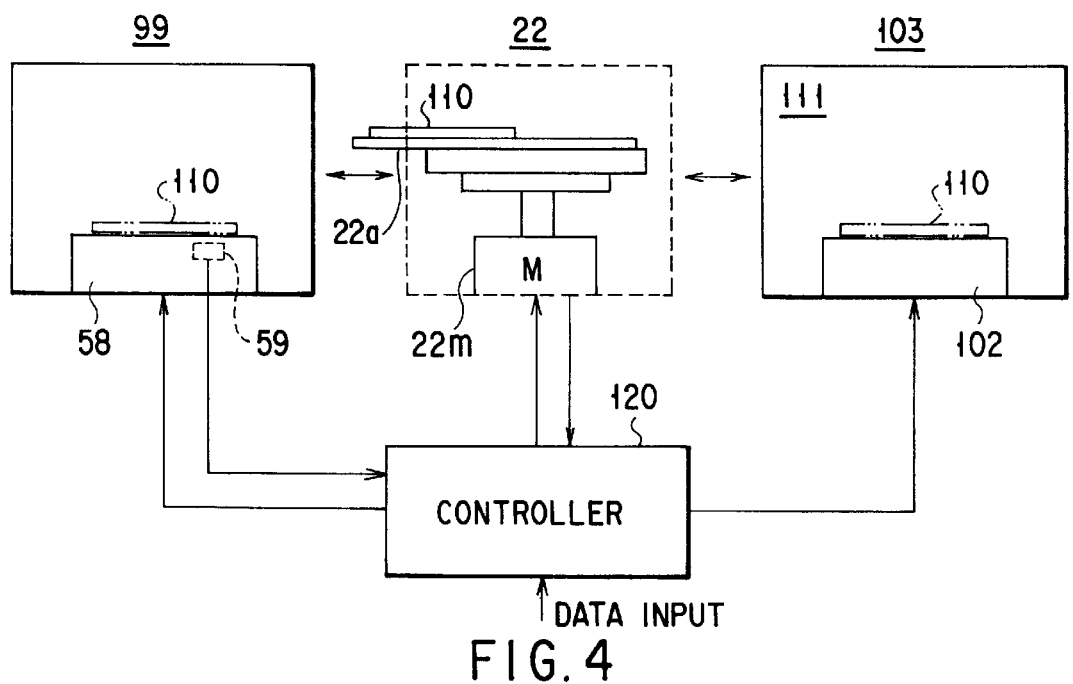
FIG. 4 is a block diagram showing a heat processing apparatus according to an embodiment of the present invention.

As shown in FIG. 4, a temperature sensor 59 is provided to a hot plate 58 of a heating unit 99. A signal line of the sensor 59 is connected to an input portion of the controller 120. A plurality of temperature detection signals are sent from individual sensors 59 and individually input to the controller 120. To the input portion of the controller 120, a signal line from a sensor (not shown) of the main arm mechanism 22 is connected. The sensor checks operation of the driving section 22m in terms of the rotation number and input the signal into the controller 120. Furthermore, to the input portion of the controller 120, a data-input keyboard (not shown) is connected by which data of a recipe corresponding to each lot is input.

On the other hand, to an output portion of the controller 120, a power source (not shown) for a hot plate 58 of the heating unit 99, a power source 122 (see FIG. 7) for a cooling plate 102 of a refrigeration section 103, and a power source (not shown) for the driving section 22m of the main arm mechanism 22, are independently connected. The controller 120 controls the power source 122 for the cooling plate 102 on the basis of the temperature detection signal and the operation check signal (i.e., rotation counting signal). In other words, the temperature of the refrigeration medium 110 refrigerated in the refrigeration unit 103 as well as time for cooling the hot plate 58 by the refrigeration medium 110 (which has been refrigerated by the refrigeration unit 103) mounted on the hot plate 58 are obtained by the controller. The controller 120 further controls the power source 122 on the basis of the temperature and the time thus obtained. In this manner, the hot plate 58 can be reduced in temperature efficiently in the minimum time.

Figure 9:
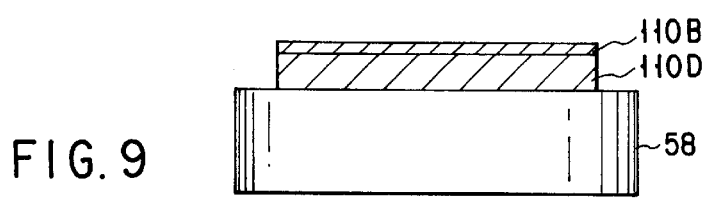
FIG. 9 is a longitudinal sectional view showing the refrigeration section of the apparatus according to an embodiment.
Figure 10:
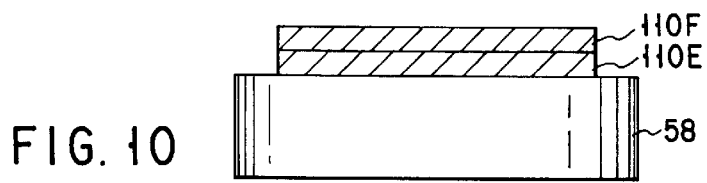
FIG. 10 is a longitudinal sectional view showing the refrigeration section of the apparatus according to the embodiment.

As another temperature controlling method for the hot plate, a refrigeration section 103 housing a plurality of refrigerants different in heat capacity, may be employed, as shown in FIGS. 9–11. In this case, the controller 120 calculates the balance between incoming and outgoing heat amounts on the basis of the temperature of the hot plate 58 and a predetermined heat processing temperature on recipe, with respect to a plurality of refrigeration members 110A, 110B, 110C, 110D, 110E, 110F, 110G and 110H. In this way, the most suitable refrigerant is selected and allowed in contact with the hot plate 58.

Alternatively, an appropriate refrigeration medium 110 may be selected from the refrigeration members 110A to 110H and allowed to be in contact with the hot plate 58. In this case, as a first strategy, the refrigeration medium 110 having the most suitable heat capacity may be selected on the basis of the actually measured temperature of the hot plate 58 and the predetermined temperature on recipe (first strategy: heat-capacity choice). Note that thickness of the refrigeration medium 110 may be varied within the range of 1 to 10 mm. It is desirable to prepare a series of refrigeration medium 110 having various heat capacities. For example, refrigeration members 110A, 110B, 110C, and 110D having a thickness of 1 mm, 2.5 mm, 4 mm, and 5.5 mm can be prepared and stored in refrigeration chambers 11A, 111B, 111C and 111D, respectively. Furthermore, it is desirable that a high purity silicon (Si), silica glass ($SiO_2$) and silicon carbide (SiC) may be used as the refrigeration medium 110. These materials are stable in the high temperature range and do not contaminate the silicon wafer.

As a second strategy, a desired refrigeration temperature of the refrigeration medium 110 is obtained by the controller 120 on the basis of the actually measured temperature of the hot plate 58 and the predetermined temperature on recipe, and then, the refrigeration medium 110 may be refrigerated by the refrigeration unit 103 so as to reach the desired refrigeration temperature (second strategy: refrigeration driving control).

Furthermore, as a third strategy, the contact time for the refrigeration medium 110 to be contact with the hot plate 58 is first obtained by the controller 120 on the basis of the actually measured temperature of the hot plate 58 and the predetermined temperature on recipe, and then the refrigeration medium 110 may be loaded and unload into and from the heating unit 99 so as to satisfy the contact time thus obtained (third strategy: cooling time control).

Note that two or three strategies selected from the first to third strategies may be used in combination. Any strategy is preferable as an efficient controlling method.

Figure 5:
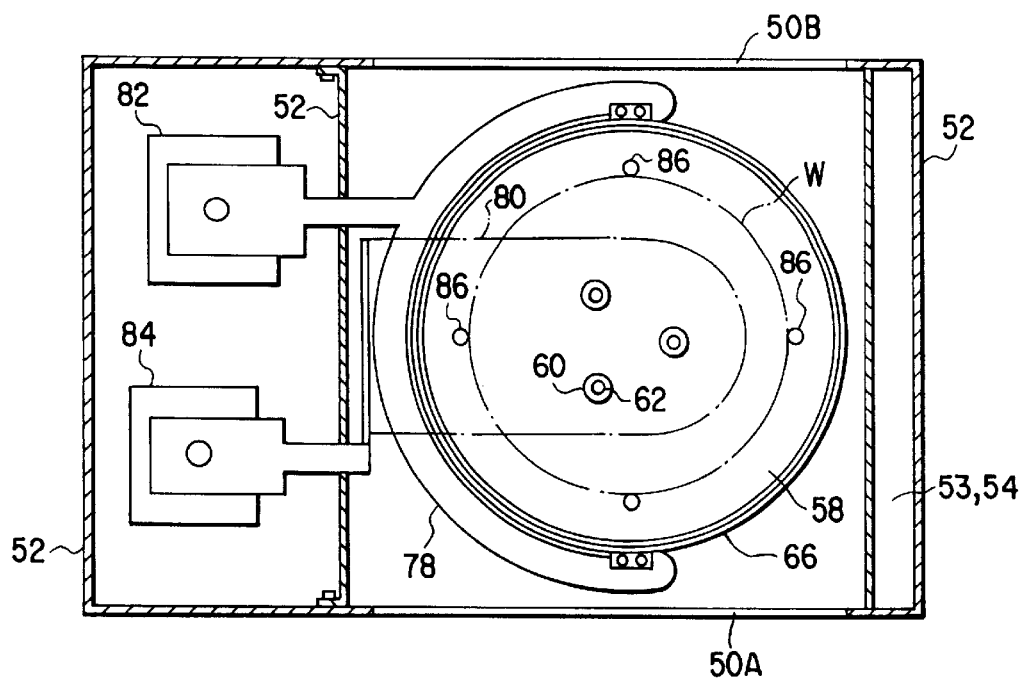
FIG. 5 is a plan view showing a heating unit of the heat processing apparatus according to an embodiment of the present invention.
Figure 6:
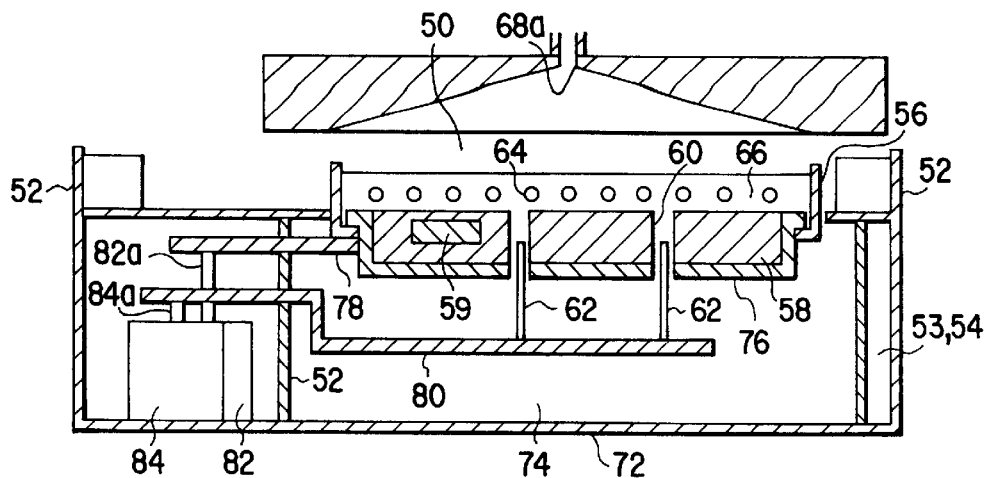
FIG. 6 is a longitudinal sectional view of the heating unit of the heat processing apparatus according to an embodiment of the present invention.

Referring now to FIGS. 5 and 6, the heating unit 99 will be explained.

The heating unit 99 includes a prebaking unit (PREBAKE) a postbaking unit (POBAKE), and an adhesion unit (AD) for heating the wafer W to a temperature at least higher than room temperature. A processing chamber 50 of the heating unit 99 has a hot plate 58 having a heater of resistance heating (not shown) and a temperature sensor 59 therein. The hot plate has a thickness of 3 mm made of ceramics. The heat capacity of the hot plate is approximately 164 J/K.

Figure 14:
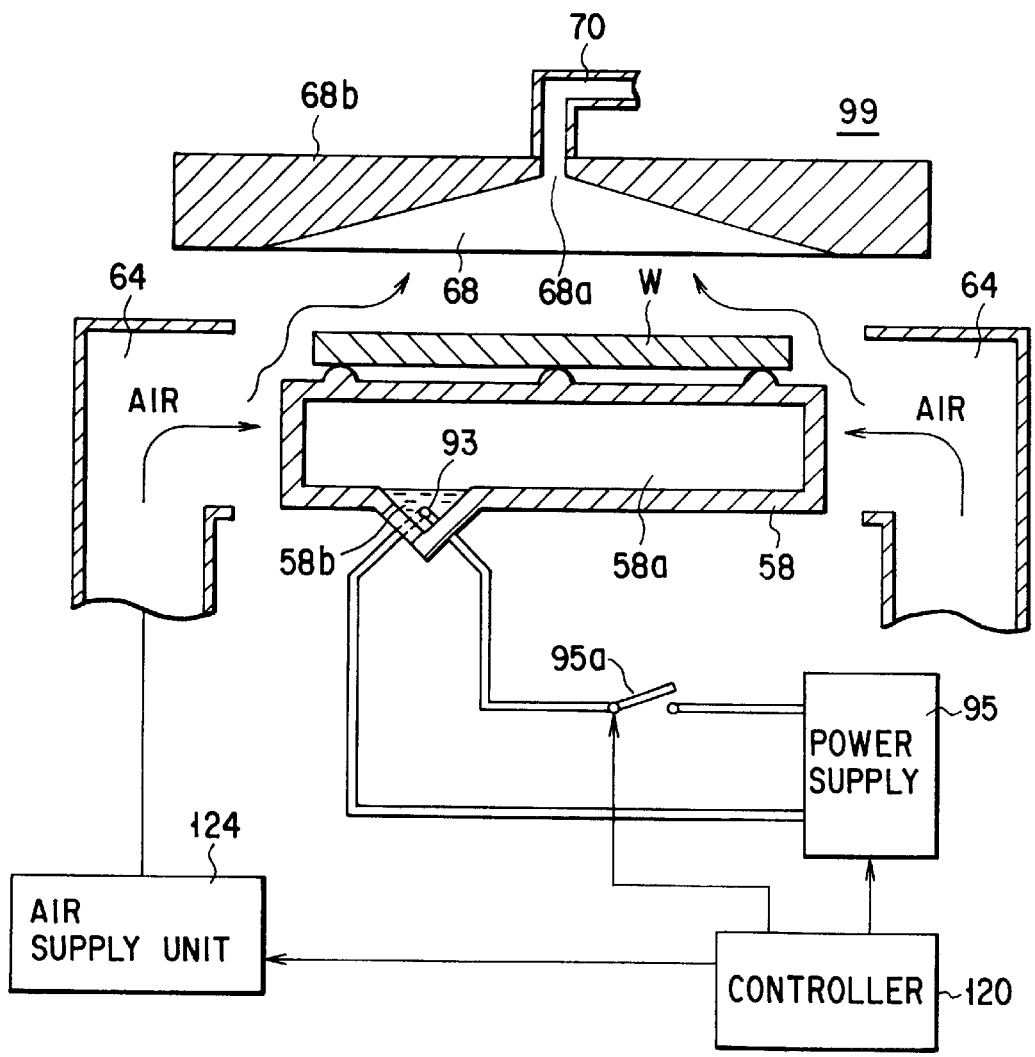
FIG. 14 is a cross sectional view of a heating unit of a heat processing apparatus according to a further embodiment accompanying a block diagram of peripheral elements.

Note that the hot plate 58 may be constructed in a jacket form having a hollow portion therein. The wafer W may be heated by supplying and circulating a heat medium through the hollow portion. Alternatively, as shown in FIG. 14, heat pipes 58b, 93 may be introduced into a vacant space within the hot plate 58a to heat the hot plate 58.

The processing chamber is defined by a side wall 52, a horizontal shielding plate 55, and a cover 68. Opening portions 50A, 50B are formed respectively at the front side (near a passage of the main arm mechanism 22) and a back side of the processing chamber 50. The wafer W is loaded into and unloaded from the processing chamber 50 through the openings 50A and 50B. A circular opening 56 is formed at the center of the horizontal shielding plate 55. The hot plate 58 is housed in the opening 56. The hot plate 58 is supported by a supporting plate 76 in concert with the horizontal shielding plate 55.

Three holes 60 are formed through the hot plate 58. A lift pin 62 is inserted into each of three holes 60. Three lift pins 62 are connected to and supported by an arm 80. The arm 80 is connected to and supported by a rod 84a of a vertical cylinder 84. When the rod 84a is allowed to project from the cylinder 84, the lift pins 62 project to lift up the wafer-W from the hot plate 58.

A ring-form shutter 66 is attached to the outer periphery of the hot plate 58. A plurality of air holes 64 are formed along the periphery of the shutter 66 at intervals of central angles of 2°. The air holes 64 communicate with a cooling gas supply source (not shown).

The shutter-66 is liftably supported by a cylinder 82 via an arm 78. The shutter 66 is positioned at a place lower than the hot plate 58 at non-operation time and lifted to a position higher than the hot plate 58 and between the hot plate 58 and the cover 68, at an operation time, as shown in FIG. 6. When the shutter 66 is lifted up, nitrogen gas or air (cooling gas) blows out from the air holes 64.

An exhaust port 68a is opened at the center of the cover 68 so as to communicate with the exhaust pipe 70. Gas generated from the surface of wafer W at the heating processing time is exhausted through the exhaust port 68a. The exhaust pipe 70 communicates with a duct 53 (or 54) at the front side (near the main arm mechanism 22) of the apparatus or another duct (not shown).

A machine room 74 is formed below the horizontal shielding plate 55. The machine room 74 is defined by the shielding plate 55, two side walls 53 and a bottom plate 72. In the machine room 74, a hot plate supporting plate 76, a shutter arm 78, a lift pin arm 80, a liftable cylinder 82, and a liftable cylinder 84 are arranged.

As shown in FIG. 5, four projections 86 are formed on an upper surface of the hot plate 58. The wafer W can be positioned at a right place by means of the four projections 86. In addition, a plurality of small projections (not shown) are formed on the upper surface of the hot plate 58. When the wafer W is mounted on the hot plate 58, top portions of these small projections come in touch with the wafer W. By virtue of the presence of the small projections, a small gap is formed between the wafer W and the hot plate 58. It is therefore possible to prevent the lower surface of the wafer W from being stained and damaged.

Referring now to FIGS. 7 to 13, various refrigeration sections 103 will be explained.

Figure 7:
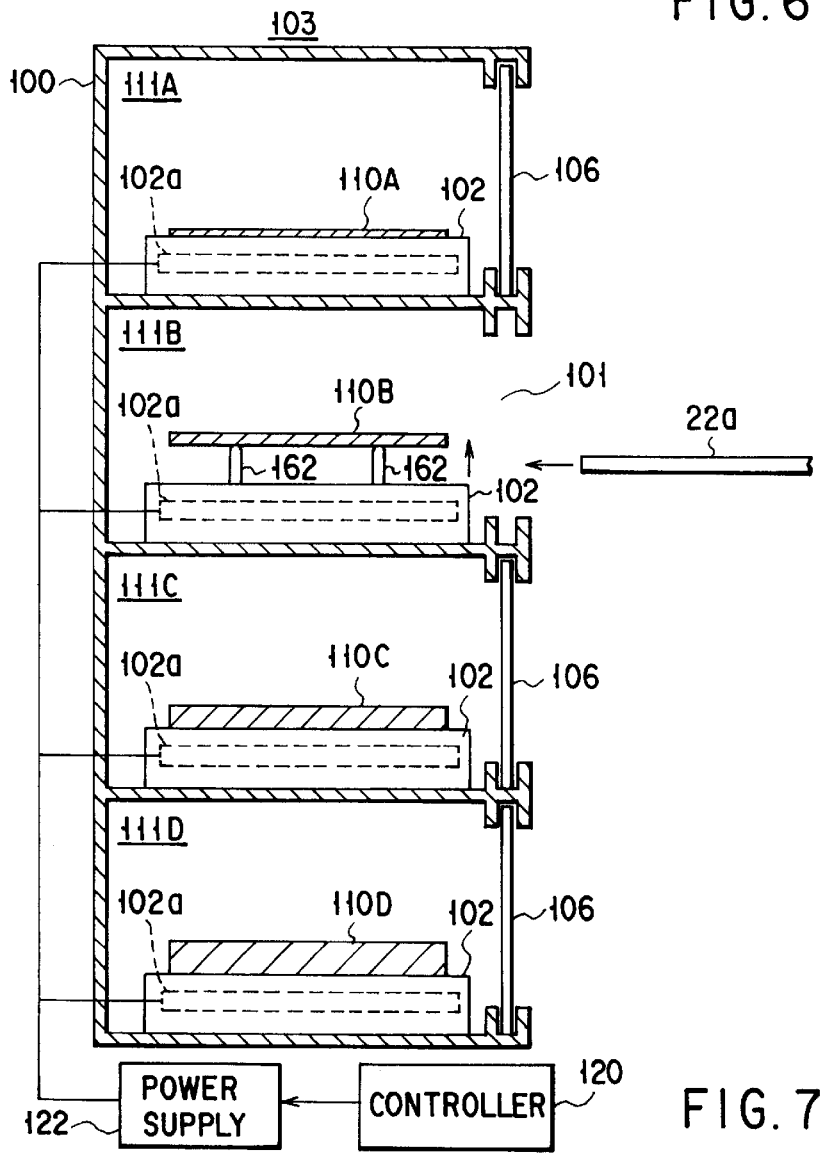
FIG. 7 is a sectional view of a refrigeration section of the heat processing apparatus according to the present invention accompanying a block diagram of peripheral elements.

The refrigeration section 103 may be formed of a plurality of compartments (refrigerators) 111A–111D stacked in multiple stages, as shown in FIG. 7. Alternatively, the refrigeration section 103 is formed of a single compartment 111E as shown in FIG. 11. As the refrigeration medium 110, refrigeration members 110B and 110D different in thickness (different in heat capacity) or the refrigeration members 110E and 110F different in material (different in heat capacity) may be stacked upon the hot plate 58. In the case where a sufficient heat capacity is not expected to obtain by the presence of the refrigeration member 110D (5.5 mm thick) alone, the refrigeration member 110B (2.5 mm thick) may be stacked upon the refrigeration member 10D, as shown in FIG. 9. In the case where a sufficient heat capacity is not expected to obtain by the presence of the refrigeration member 110E made of pure silicon, the refrigeration member 110F made of silicate glass (or silicon carbide) may be further stacked upon the refrigeration member 110E, as shown in FIG. 10. To improve a heat exchange rate (heat conductivity) between the hot plate 58 or a cooling plate 102 and the refrigeration medium 110, a minute fin or an elastic layer may be formed on the lower surface of the refrigeration medium 110.

Figure 8:
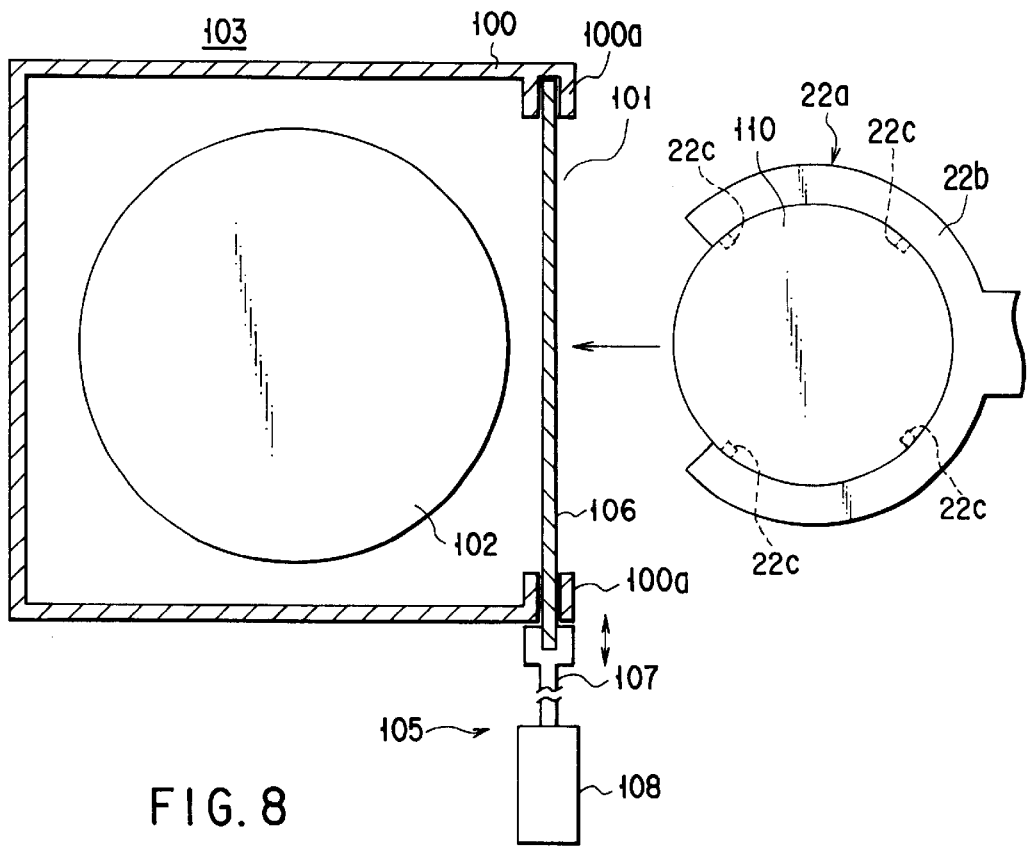
FIG. 8 is a plan view of the refrigeration section of the heat processing apparatus according to the present invention.

As shown in FIG. 7, a housing 100 of the refrigeration section 103 is divided into 4 compartments 11A, 111B, 111C, and 111D. The cooling plate 102 is housed in each of the compartments 11A, 111B, 111C, and 111D. The refrigeration members 110A, 110B, 110C and 110D different in heat capacity (different in thickness) are respectively mounted on the cooling plates 102 of four compartments. A shutter 106 is attached to each of loading or unloading port 101 of the compartments 11A, 111B, 111C, and 111D. A plurality of through-holes (not shown) are formed through the cooling plate 102. A lift pin 162 is provided through each of the through-holes so as to protrude from the cooling plate 102. When the shutter 106 is opened, the refrigeration member 110B is lifted up by the lift pins 162. A holder 22a of the main arm mechanism is inserted into the compartment 111B and then the lift pins 162 are moved down. In this way, the refrigeration member 110B is transferred from the lift pins 162 to the arm holder 22a. Note that to reduce the size of the compartments 111A, 111B, 111C, and 111D in the Z direction as small as possible, the shutter 106 is connected to the rod 107 of the horizontal cylinder 108, as shown in FIG. 8, thereby sliding in the horizontal direction.

The cooling plate 102 houses a cooling element 102a. Electric power is supplied to each of the cooling elements 102a from a common power source 122 controlled by the controller 120. As the cooling element 102a, a thermoelement using Peltier effect, is used. Furthermore, a temperature sensor (not shown) may be buried in the cooling plate 102. The temperature sensor plays a role in detecting temperature of the cooling plate 102 and send a signal of the detected temperature to the controller 120.

The refrigeration members 110A, 110B, 10C, 110D are formed of pure silicon disks having substantially the same diameter of the wafer W. However, they are different in thickness, e.g., 1 mm, 2.5 mm, 4 mm, 5.5 mm, respectively. Therefore, refrigerants different in heat capacity can be provided. The refrigerants used in this embodiment are uniform in thickness. However the center portions of the refrigerants may be slightly thicker than the peripheral portion. Such a refrigerant may make up for the insufficiency in cooling ability of the center portion.

As the cooling plate 102, a refrigerant jacket may be used which is constituted of a disk-form plate made of metal such as aluminium or copper and a refrigerant passage formed inside the jacket. In this case, the controller drives a refrigerator compressor while controlling, thereby controlling a refrigerant flow rate to a refrigerant jacket. In this manner, the cooling ability of the refrigerator compressor can be controlled.

As shown in FIG. 8, the cooling plate 102 is positioned virtually at the center of the housing 100 (box form) of the refrigeration section 103. The refrigeration medium 110 is loaded into and unloaded from the refrigeration section 103 by the main arm mechanism 22. The holder 22a of the main arm mechanism has a plurality of support projections 22c protruding toward the inside of the ring member 22b. By the presence of the support projections 22c, the refrigeration medium 110 is in contact with and supported by the ring member 22b at the peripheral portion alone. Not that not only the refrigeration medium 110 but also the wafer W may be cooled in the refrigeration section 103.

Now, referring to FIGS. 11–13, a refrigeration section 103 of another embodiment will be explained.

The refrigeration section 103 has a single compartment 111E, which is capable of cooling two refrigeration members 110G and 110H placed therein. The compartment 111E is partitioned into upper and lower chambers 201, 202 by a horizontal partition plate 100c. The upper chamber 201 has a port 101 opened or closed by a shutter 106 and a cooling plate 102A. The lower chamber 202 has first and second lift pins 262, 263, horizontal arms 281, 283, liftable cylinders 282, 284. Driving sources (not shown) for two liftable cylinders 282, 284 are independently controlled by the controller 120.

Three first lift pins 262 are supported by the horizontal arm 281, which is connected to a rod 282a of the liftable cylinder 282. Three second lift pins 263 are supported by the horizontal arm 283, which is connected to a rod 284a of the liftable cylinder 284. Three first through-holes 102c and three second through-holes 102d are formed through the cooling plate 102A. The first lift pin 262 is inserted into each of the first through holes 102c, and the second lift pin 263 is inserted into each of the second through holes 102d. The first and second through-holes 102c, 102d may be arranged at equal intervals on a common concentric circle 266 as shown in FIG. 12 or may be arranged respectively on two concentric circles 267, 268 at equal intervals, as shown in FIG. 13.

As shown in FIG. 11, two refrigeration members 110G, 110H are stacked one upon the other on the cooling plate 102A, as shown in FIG. 11. The upper refrigeration member 110H is lifted up by the first lift pins 262. The lower refrigeration member 110G is lifted up by the second lift pins 263. The upper and lower refrigeration members 110G, 110H have substantially the same diameter of the wafer W and made of pure silicon. The lower refrigeration member 110G is thicker than the upper refrigeration member 110H. The heat capacity of the lower refrigeration member 110G is nearly double of the upper refrigeration member 110H. In the lower refrigeration member 110G, three through-holes 102c are formed for inserting the lift pins 262 therethrough, as shown in FIGS. 12 and 13.

Next, we will explain how to process the wafer W by using the aforementioned apparatus.

When a main switch of the coating/developing system 1 is turned on, power supply is initiated to the heating unit 99 and the refrigeration section 103 from respective power sources. The hot plate 58 of the heating unit 99 is controlled to set at a predetermined processing temperature. The cooling pate 102 of the refrigeration section 103 is controlled to be set at, for example, 10° C. The temperature of the cooling plate 102 is set in consideration of the predetermined heat processing temperature (heat processing temperature to be applied to the wafer W in each of the heating processes for each lot) and the heat capacity of the hot plate 58. The time required for the refrigeration medium 110 to be in contact with the hot plate 58 is calculated by the controller 120 using a predetermined equation for seeking the balance between incoming and outgoing heat amounts, on the basis of there conditions (temperature, heat capacity, heat dissipation coefficient). It is possible to know, for example, how many seconds are required for the refrigeration medium 110 (having a heat capacity of a certain value or more) to be in contact with the hot plate 58, in order to decrease the temperature of the hot plate 58 from 120° C. to 90° C. by use of the refrigeration medium 110 of 10° C. Note that it may be better for the refrigeration medium 110 to have a total heat capacity larger than that of the hot plate 58.

The wafer W is taken out from the cassette CR by the sub arm mechanism 21 and transferred to the main arm mechanism 22. The main arm mechanism 22 transfers the wafer W into the resist coating unit (COT) 22. In the resist coating unit (COT), resist is coated on the surface of the wafer W. Then, the main arm mechanism 22 takes the wafer W from the resist/coating unit (COT) and transfers it to a prebake unit (PREBAKE) of the heating unit 99.

Then, the shutter 56 is opened to insert the arm holder 22a into the processing chamber 50. Subsequently, the pins 62 are moved up to transfer the wafer W from the arm holder 22a onto the pins 62. The arm holder 22a is unloaded from the processing chamber 50 and the pins 62 are moved down to place the wafer W onto the hot plate 58. At this time, the hot plate 58 is maintained at, for example, 120° C.

After heat processing at 120° C. is completed with respect to a manufacturing lot of wafers W, the wafers W of another manufacturing lot are prepared for heat treatment under different temperature condition, for example, at a temperature of 90° C.

The main arm mechanism 22 is moved to the refrigeration section 103 to take out the refrigeration medium 110 cooled to 10° C. The main arm mechanism 22 is moved to the heating unit 99 while holding the refrigeration medium 110. Then, the shutter 56 is opened to insert the arm holder 22a into the processing chamber 50. Subsequently, the pins 62 are moved up to transfer the refrigeration medium 110 from the arm holder 22a to the pins 62. The arm holder 22a is unloaded from the processing chamber 50, and the pins 62 are moved down to place the refrigeration medium 110, onto the hot plate 58. After a predetermined time, the refrigeration medium 110 is picked up from the hot plate 58 by the main arm mechanism 22 and returned onto the cooling plate 102 in-the refrigeration section 103. The hot plate 58 is cooled to a desired temperature of about 90° C. by the refrigeration medium 110 and maintained at 90° C.

When the sensor 59 detects the temperature of the hot plate 58 and the controller 120 confirms that thee temperature of the hot plate 58 is maintained stable at 90° C., the controller 120 sends an instruction signal to the main arm mechanism 22. Upon reception of the instruction signal, the main arm mechanism 22 initiates loading of the wafers W of another manufacturing lot. The wafers of this manufacturing lot are heat-processed at 90° C. and thereafter subjected to further treatment.

In the apparatus according to this embodiment, a refrigeration section 103 is arranged other than the hot plate 58. When the hot plate 58 is cooled, the refrigeration medium 110 which has been previously cooled in the refrigeration section 103, is placed on the hot plate 58 for a predetermined time. It is therefore possible to reduce the temperature of the hot plate in a short-time.

In the apparatus of this embodiment, only refrigeration section 103 is added without providing any modification to the heating unit. Since the hot plates are not increased in number, enlargement of the apparatus in size is suppressed at minimum.

Now, referring to FIG. 14, the heating unit of another example will be explained.

A depressed portion 68b of a conical shape is formed in the lower portion of the cover 68. An exhaust port 68a is formed near the top of the cone. To the exhaust port 68a, a lower end of an exhaust tube 70 is connected. The other end of the exhaust tube 70 communicates with an evacuation system (not shown). The gas heated by the hot plate 58 and moved up, is collected at the depressed portion 68 and exhausted through the exhaust port 68a and the exhaust tube 70.

In the heating unit 99, an inner space of the hot plate 58 is a vacant hole 58a closed airtight. A heat medium storage 58b having a V-shape cross-section is formed in part of the bottom portion of the vacant hole 58a. In the heat medium 58b, a resistance heater 93 made of dichromatic wire is arranged in the direction from the front side to the back side of the figure. Electric power is supplied to the heater 93 from the power supply unit 95 controlled by a controller.

When power is supplied from the power supply unit 95 to the heater 93, the heater 93 initiates heat generation. The heat medium which has been condensed in the heat medium storage 58b, is heated by the heater 93. The heat medium thus heated is gasified, vaporized and circulates within the vacant hole 58a. When the vapor from the heat medium comes in contact with a cooled portion of the vacant hole 58a, the vapor gives heat quantity to the cooled portion and simultaneously condensed. At this time, the heat quantity is the heat of vaporization of the heat medium which is determined depending upon a type of heat medium. Therefore, a series of cycle starting from the vaporization of the heat medium to the condensation thereof reaches stable and constant conditions, the temperature of the hot plate 58 can be kept almost constant.

We have explained the case in which the present invention is applied to the resist coating/developing system for use in a semiconductor wafer in the aforementioned embodiments. However, the present invention may be applied to a resist coating/developing system for use in an LCD substrate.

According to the present invention, since the temperature of the hot plate can be reduced immediately by the refrigerant, the throughput in processing can be improved remarkably. According to the present invention, the conventionally-used heating unit can be used as it is without any modification, the controlling system need not to be complicated. As a result, it is possible to suppress an increase in manufacturing cost at minimum. In addition, the refrigeration section to be added is simply constructed. The controlling system is thus simple and malfunction of the apparatus rarely occurs.

It is therefore possible to improve the throughput in processing without reducing the operation rate of the apparatus. Moreover, the balance between incoming and outgoing heat amounts is calculated on the basis of the actually-measured temperature and a predetermined temperature for heat processing of the hot plate. Based on the calculation, the refrigerant having the most suitable heat capacity is selected, and time for the refrigerant in contact with the hot plate is determined. It is therefore possible to cool the hot plate to the predetermined temperature efficiently in the shortest time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat processing apparatus comprising;

a heating section having a hot plate for heating a substrate in a heat conduction manner;

refrigeration medium for decreasing temperature of the hot plate in a heat exchange manner by bringing the refrigeration medium in direct or indirect-contact with the hot plate;

a refrigeration section for storing the refrigeration medium while cooling;

a transport mechanism for taking out the refrigeration medium from the refrigeration section, transporting the refrigeration medium to the heating section, mounting the refrigeration medium on the hot plate, picking up the refrigeration medium from the hot plate, taking out the refrigeration medium from the heating section, and transporting the refrigeration medium to the refrigeration section;

setting means for setting a heat processing temperature for the substrate; and a controller for controlling temperature of the hot plate by using the refrigeration medium so as to reach the heat processing temperature set by the setting means.

2. The apparatus according to claim 1, further comprising a sensor for detecting temperature of the hot plate.

3. The apparatus according to claim 2, wherein said controller controls the contact time for the hot plate in contact with the refrigeration medium on the basis of the temperature of the hot plate detected by the sensor and the heat processing temperature determined.

4. The apparatus according to claim 3, wherein said refrigeration medium includes a plurality of refrigeration members different in heat capacity;

said controller selects one or two refrigeration members from said plurality of refrigeration members on the basis of the temperature of the hot plate detected by the sensor and the heat processing temperature determined;

said transport mechanism transports said one or two refrigeration members selected from the refrigeration section to the heating section, mounting said one or two refrigeration members on the hot plate to allow said one or two refrigeration members in contact with the hot plate for the contact time, and transporting said one or two refrigeration members from the heating section to refrigeration section.

5. The apparatus according to claim 2, wherein said controller controls temperature for cooling the refrigeration medium in the refrigeration section on the basis of the temperature of the hot plate detected by the sensor and the heat processing temperature determined.

6. The apparatus according to claim 1, wherein said refrigeration medium has a shape substantially the same as that of the substrate.

7. The apparatus according to claim 1, wherein said refrigeration medium is made of a material containing no harmful ingredients to not only the substrate but also a film formed on the substrate.

8. The apparatus according to claim 1, wherein said refrigeration medium includes a plurality of refrigeration members; and said plurality of refrigeration members are made of substantially the same material and have substantially the same shape as that of the substrate but differ in thickness.

9. The apparatus according to claim 1, wherein said refrigeration medium includes a plurality of refrigeration members different in heat capacity, said plurality of refrigeration members having substantially the same shape but different in material.

10. The apparatus according to claim 1, wherein said transporting mechanism transports the refrigeration medium on the hot plate so as to cover an area of the hot plate at which the substrate comes in contact with the hot plate or near which the substrate is placed so as to face the hot plate.

11. The apparatus according to claim 1, wherein said refrigeration section has a plurality of cooling plates each cooling the corresponding refrigerant in a heat conduction manner, a lift mechanism having a plurality of pins pushing up the refrigeration medium from each of the cooling plates; and a plurality of compartments each surrounding the corresponding cooling plate.

12. The apparatus according to claim 1, wherein said refrigeration section has a cooling plate for collectively cooling a plurality of refrigeration members stacked one upon the other in multiple stages, a lift mechanism having a plurality of pins for pushing up at least one of said plurality of refrigeration members from the cooling plate, and a compartment surrounding the cooling plate.

13. The apparatus according to claim 12, wherein said plurality of pins are arranged on a common concentric circle in the same plane.

14. The apparatus according to claim 12, wherein said plurality of pins are arranged by being divided on two concentric circles in the same plane.

* * * * *